(12) United States Patent
Nagase et al.

(10) Patent No.: US 7,761,982 B2
(45) Date of Patent: Jul. 27, 2010

(54) METHOD FOR MANUFACTURING IC-EMBEDDED SUBSTRATE

(75) Inventors: Kenji Nagase, Tokyo (JP); Kenichi Kawabata, Tokyo (JP)

(73) Assignee: TDK Corporation, Tokyo (JP)

( * ) Notice: Subject to any disclaimer, the term of this patent is extended or adjusted under 35 U.S.C. 154(b) by 640 days.

(21) Appl. No.: 11/612,419

(22) Filed: Dec. 18, 2006

(65) Prior Publication Data

US 2007/0141759 A1 Jun. 21, 2007

(30) Foreign Application Priority Data

Dec. 19, 2005 (JP) ............... 2005-364458

(51) Int. Cl.
*H05K 3/30* (2006.01)
*H01L 23/48* (2006.01)
(52) U.S. Cl. ............... 29/832; 29/830; 29/831; 29/837; 29/844; 29/846; 257/758
(58) Field of Classification Search ............ 29/830, 29/832, 831, 842, 837, 844, 846, 848, 855; 257/746, 758; 174/104, 96, 266, 263
See application file for complete search history.

(56) References Cited

U.S. PATENT DOCUMENTS

| | | | |
|---|---|---|---|
| 5,306,670 A | * | 4/1994 | Mowatt et al. ........... 29/832 |
| 5,745,984 A | * | 5/1998 | Cole et al. .............. 29/834 |
| 5,875,100 A | | 2/1999 | Yamashita |
| 6,326,559 B1 | * | 12/2001 | Yoshioka et al. ......... 174/261 |
| 6,948,944 B2 | * | 9/2005 | Ueno .................... 439/68 |

FOREIGN PATENT DOCUMENTS

| | | |
|---|---|---|
| CN | 1198652 A | 11/1998 |
| JP | 09-321408 | 12/1997 |
| JP | H09-321408 A | 12/1997 |
| JP | 2001-237347 | 8/2001 |
| JP | 2001-250902 | 9/2001 |

OTHER PUBLICATIONS

JPO Office Action in JP counterpart application dated Jun. 19, 2009 (6 pages).

* cited by examiner

*Primary Examiner*—Derris H Banks
*Assistant Examiner*—Tai Nguyen
(74) *Attorney, Agent, or Firm*—Young Law Firm, P.C.

(57) ABSTRACT

A method for manufacturing an IC-embedded substrate comprises a first step for encapsulating at least an IC chip having a pad electrode in an insulating layer, a second step for forming a metal layer having at least a first aperture in a location directly above the pad electrode of the IC chip and a second aperture in a location above an area other than the area in which the IC chip is mounted, and a third step for selectively removing the insulating layer by a blasting treatment in which the metal layer is used as a mask, whereby forming a first via hole that corresponds to the first aperture and a second via hole that corresponds to the second aperture.

9 Claims, 13 Drawing Sheets

FIG.18

METHOD FOR MANUFACTURING IC-EMBEDDED SUBSTRATE

TECHNICAL FIELD

The present invention relates to a method for manufacturing an IC-embedded substrate, and particularly relates to a method for forming via holes in a multilayer substrate in which an IC is embedded.

BACKGROUND OF THE INVENTION

Printed wiring boards having a highly dense mounted structure are known to have structures in which printed substrates are fashioned in multiple layers and semiconductor IC chips are embedded therein (see Japanese Patent Application Laid Open No. 2001-237347). Methods used for exposing a pad electrode of a semiconductor IC chip embedded into a printed wiring substrate include a method whereby a laser is used to form a via hole directly above the pad electrode (see Japanese Patent Application Laid Open No. 9-321408); and a method in which the entire surface of a resin layer in which the semiconductor IC chip is encapsulated is polished and the pad electrode is exposed (see Japanese Patent Application Laid Open No. 2001-250902).

The following problems are encountered in the method for exposing an electrode pad by using a laser to form a via hole (Japanese Patent Application Laid Open No. 9-321408). First, when a via hole is formed directly above a pad electrode of a semiconductor IC chip, the semiconductor IC chip will be damaged if the via hole is formed by laser processing in the same manner as a via hole in a regular IC substrate because the semiconductor IC chip will be directly subjected to thermal shock, and the yield will deteriorate. Particularly, since the pad electrodes of the semiconductor IC chip are disposed at a fine pitch, the precision with which the processing is performed is necessarily very high, and certain laser devices may not be capable of such precision. Since the number of via holes increases along with the number of pad electrodes on a semiconductor IC chip, the production capacity of the laser device inevitably fluctuates, and productivity declines.

The following problems are encountered in the method for exposing a pad electrode of a semiconductor IC chip by polishing the entire surface of an encapsulating resin layer (Japanese Patent Application Publication No. 2001-250902). When the entire surface of the encapsulating resin is polished, the semiconductor IC chip is often damaged due to the load applied to the substrate, and a reduced yield results. The range within which the degree of polishing can be set is limited, and it is extremely difficult to minimize polishing variation. When a semiconductor IC chip having pad electrodes of varying height is encapsulated, not all of the pad electrodes can be exposed. When a semi-additive method is used to form electrical connections between the pad electrodes and a wiring pattern, electroless plating and electroplating must be sequentially performed on the polished resin surface. However, reliability declines due to the low adhesive strength between the polished resin surface and the electroless plating.

Furthermore, semiconductor IC chips embedded in substrates are different from other electronic components, and comprise many expensive parts. Therefore, a demand has arisen for a manufacturing method that does not damage the semiconductor IC chips and offers stable yields.

SUMMARY OF THE INVENTION

It is therefore an object of the present invention to provide a method for manufacturing a semiconductor IC-embedded substrate that prevents the semiconductor IC chips encapsulated in a resin layer from being damaged by heat or load (stress). The method can be used even when the number of pad electrodes is increased or when fine pitch applications are involved; and the adhesive strength between the resin surface and the plating surface can be adequately ensured, even in cases where a semi-additive method is used to form a conductor pattern.

The above and other object of the present invention can be accomplished by a method for manufacturing an IC-embedded substrate, comprising a first step for encapsulating, in an insulating layer, at least an IC chip having a pad electrode; a second step for forming a metal layer having at least a first aperture in a location directly above the pad electrode of the IC chip, and a second aperture in a location above an area other than the area in which the IC chip is mounted; and a third step for selectively removing the insulating layer by a blasting treatment in which the metal layer is used as a mask, whereby a first via hole that corresponds to the first aperture and a second via hole that corresponds to the second aperture are formed.

In the present invention, the third step preferably includes a step for forming the second via hole in a position that exposes a conductor pattern formed in an area other than the area in which the IC chip is mounted. Accordingly, the second via hole can be formed as a non-penetrating via hole, variation in the degree of polishing caused by the differing heights of the via holes can be absorbed because the conductor pattern functions as a stopper, and the range over which the degree of polishing is set can be expanded. Furthermore, the adhesive strength between the copper foil and the resin is increased; therefore, adequate wiring strength can be ensured. The second via hole may also be a penetrating via hole that completely penetrates the entire multilayer substrate.

In the present invention, the diameter of the second aperture is preferably larger than the diameter of the first aperture. Since the second aperture is normally deeper than the first aperture, the diameter of the bottom of the via hole can be sufficiently ensured by making the diameter of the second aperture larger than that of the first aperture.

In the present invention, another metal layer having a third aperture in a position directly above the pad electrode of the IC chip is preferably disposed between the IC chip and the metal layer. The third step preferably comprises forming the first via hole by a blasting treatment in which the metal layer and the other metal layer are used as a mask. Particularly, the diameter of the third aperture is preferably smaller than the diameter of the first aperture. Accordingly, the via hole can be formed with a higher processing precision, and fine-pitch IC chip applications can be addressed.

In the present invention, the third step preferably comprises forming a second via hole by laser-processing the location where the second aperture is formed, and then performing a blasting treatment in which the metal layer is used as a mask, whereby the smear in the second via hole is removed. Accordingly, a first via hole can be formed directly above the pad electrode of the IC chip while the smear is removed in the via hole formed by laser processing.

In the present invention, the first step may includes a step for encapsulating not only the IC chip but other electronic components in the insulating layer, particularly chip components of a passive element. When other electronic components are encapsulated with the IC chip, the number of processing holes further increases along with the number of embedded elements, and the height of the pad electrode varies. However, according to the present invention, productivity does not decrease as the number of processing holes increases, the elements are not damaged by stress during polishing, and variation in the degree of polishing due to the differing heights of the via holes can be absorbed. In other words, the present invention is able to address the assorted problems that have accompanied increasing the number of embedded elements, which has traditionally been difficult. The passive element chip component may be a passive element unit, an array, or an RLC composite part.

According to the present invention, a semiconductor IC chip is encapsulated, conformal processing is performed, and blasting is subsequently carried out to expose a pad electrode of the semiconductor IC chip. A mask for forming via holes can accordingly be formed with high precision, and the various problems caused by laser processing can be resolved. Specifically, it is possible to prevent electronic parts being damaged by heat, keep productivity from decreasing when the number of processing holes increases, and manage fine pitch electrode arrays of semiconductor IC chips.

Further, the problems that occur when the entire surface of the insulating layer is ground by polishing or the like can be resolved as described hereinbelow. Specifically, electronic parts can be prevented from being damaged under loading (stress), variation in the degree of polishing due to the differing heights of the via holes can be absorbed because the metal layer functions as a stopper, and the range over which the degree of polishing is set can be expanded. Furthermore, the adhesive strength between the copper foil and the resin is increased; therefore, adequate wiring strength can be ensured.

BRIEF DESCRIPTION OF THE DRAWINGS

The above and other objects, features and advantages of this invention will become more apparent by reference to the following detailed description of the invention taken in conjunction with the accompanying drawings, wherein.

DESCRIPTION OF THE PREFERRED EMBODIMENTS

Preferred embodiments of the present invention will now be described in detail hereinafter with reference to the accompanying drawings.

The method for manufacturing an IC-embedded substrate according to the present embodiment can be used when a semiconductor IC chip is to be mounted on a "core substrate" that constitutes an IC-embedded substrate; or when a semiconductor IC chip is to be mounted on a "build-up layer" formed on a core substrate. First, a first embodiment in which a semiconductor IC chip is mounted on a core substrate will be described in detail with reference to FIGS. 1 to 9.

Figure 1:
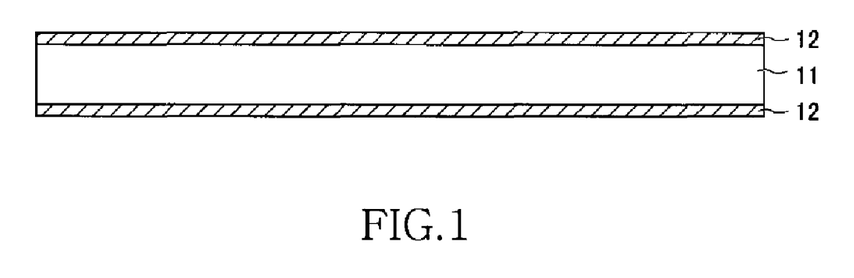
FIG. 1 is a schematic cross sectional view showing the process for manufacturing an IC-embedded substrate (Specifically preparing a core substrate 11) according to the first embodiment of the present invention.

First, a core substrate 11 is prepared when an IC-embeded substrate is manufactured according to the present embodiment (FIG. 1). The core substrate 11 serves to preserve the mechanical strength of the entire IC-embedded substrate. There are no particular limitations thereto; for example, a resin substrate having a copper foil on either side thereof can be used. The material used for the resin substrate is preferably a core material comprising a glass cloth, Kevlar material, aramid, a cloth made from a liquid crystal polymer or another resin, or a porous fluororesin sheet that has been impregnated by a thermosetting resin, thermoplastic resin, or the like. The thickness thereof is preferably about 20 μm to 200 μm. A sheet material that does not comprise LCP, PPS, PES, PEEK, PI, or other such core materials can be used for the purpose of making the laser processing conditions uniform. The copper foil 12 has a thickness of preferably about 1 to 18 μm. It is possible to minimize variation in the thickness of the copper foil 12 by using an electrolytic copper foil, which is used in printed wiring substrates (a copper foil formed by dissolving copper in a copper sulfate aqueous solution to form an ionized material, and continuously electrodepositing this material on a electrodepositing roll); i.e., by using a rolled copper foil. The thickness of the copper foil 12 may be adjusted as necessary by the SUEP method.

Figure 2:
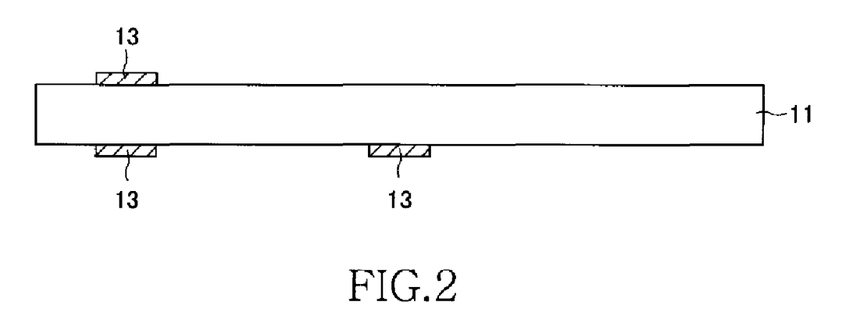
FIG. 2 is a schematic cross sectional view showing the process for manufacturing an IC-embedded substrate (Specifically forming a conductive pattern 13) according to the first embodiment of the present invention.

Next, the copper foil 12 provided to either side of the core substrate 11 is selectively removed by photolithography and etching, whereby a conductor pattern 13 comprising wiring and lands is formed on the core substrate 11 (FIG. 2). At this point, the copper foil 12 is completely removed in a prescribed area of the core substrate 11, whereby a mounting region for a semiconductor IC chip (described hereafter) is obtained.

Figure 3:
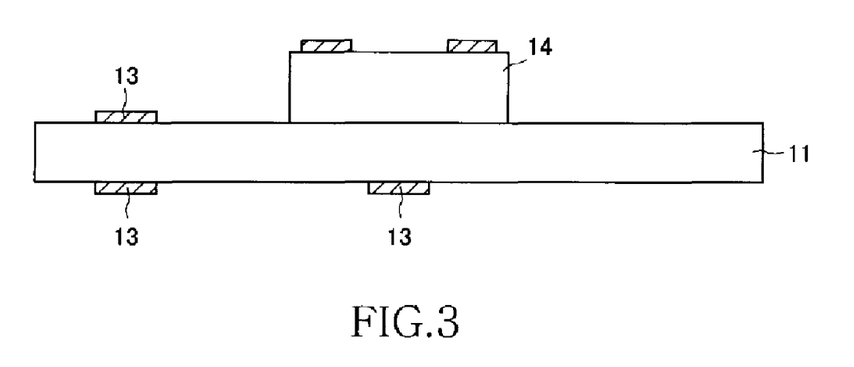
FIG. 3 is a schematic cross sectional view showing the process for manufacturing an IC-embedded substrate (Specifically mounting a semiconductor IC chip 14) according to the first embodiment of the present invention.

Next, the semiconductor IC chip 14 is mounted face up on the prescribed area of the core substrate 11 (FIG. 3). At this point, the semiconductor IC chip 14 is preferably temporarily fixed to the core substrate 11 using an adhesive or the like.

Figure 4:
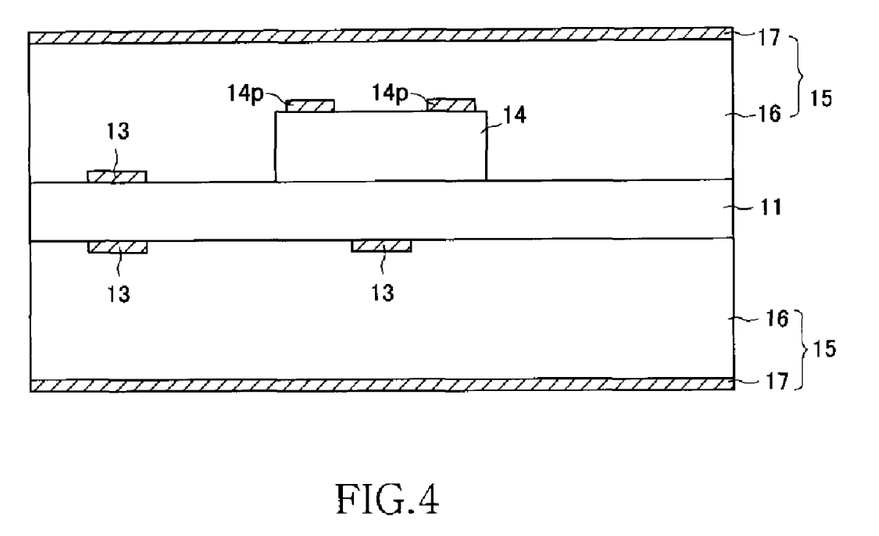
FIG. 4 is a schematic cross sectional view showing the process for manufacturing an IC-embedded substrate (Specifically affixing resin sheets 15 having a copper foil on one side) according to the first embodiment of the present invention.

Next, resin sheets 15 having a copper foil on one side are affixed to either side of the core substrate 11 on which the semiconductor IC chip 14 has been mounted (FIG. 4). In the present embodiment, the resin sheet 15 having a copper foil on one side is one in which a copper foil 17 is affixed to one side of a thermosetting resin sheet 16 comprising a B-stage epoxy resin. Two such thermosetting resin sheets 15 having a copper foil on one side are prepared, and the resin sides thereof are affixed to either side of the core substrate 11. The thermosetting resin sheets 15 having a copper foil on one side are then integrated with the core substrate 11 by a hot press. The semiconductor IC chip 14 is thereby encapsulated in the substrate, and the thermosetting resin sheet 16 and the copper foil 17 become, respectively, an insulating layer and a conductive layer of a build-up layer.

Figure 5:
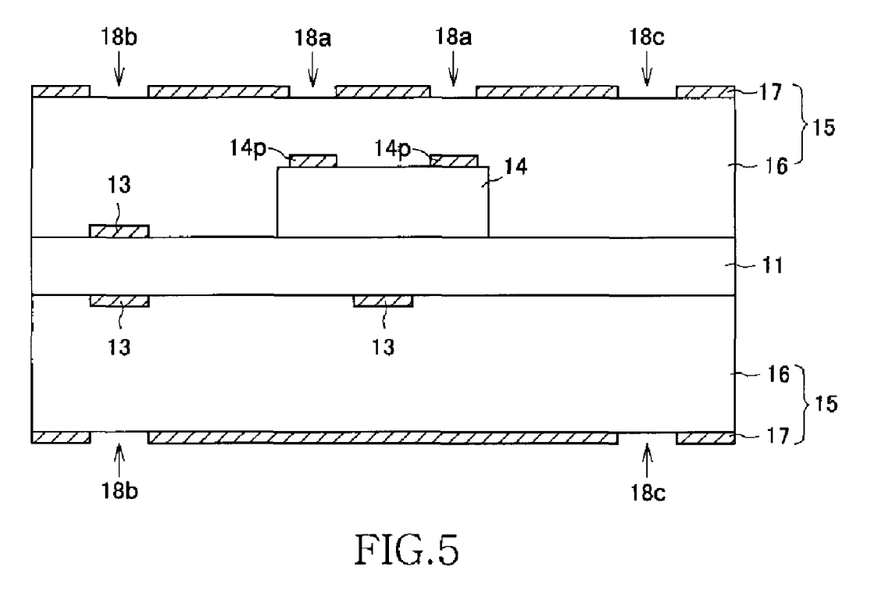
FIG. 5 is a schematic cross sectional view showing the process for manufacturing an IC-embedded substrate (Specifically a conformal process) according to the first embodiment of the present invention.

Next, the copper foil 17 formed on the surface of the build-up layer is selectively removed by a conformal process, whereby a mask pattern for forming via holes is formed (FIG. 5). The conformal process is based on photolithography and etching, and fine processing can be performed with enhanced precision by etching a pattern in the copper foil 17 affixed in advance to the thermosetting resin sheet 16 to be processed. The diameter of the aperture pattern is not particularly limited, but is preferably about 30 to 200 μm, and is preferably increased depending on the depth of the via holes.

Thus, an aperture pattern 18a is formed directly above a pad electrode 14p of the semiconductor IC chip 14; an aperture pattern 18b is formed directly above the conductor pattern 13 formed on the surface of the core substrate; and an aperture pattern 18c is formed in prescribed regions where the conductor pattern 13 has not been formed.

Figure 6:
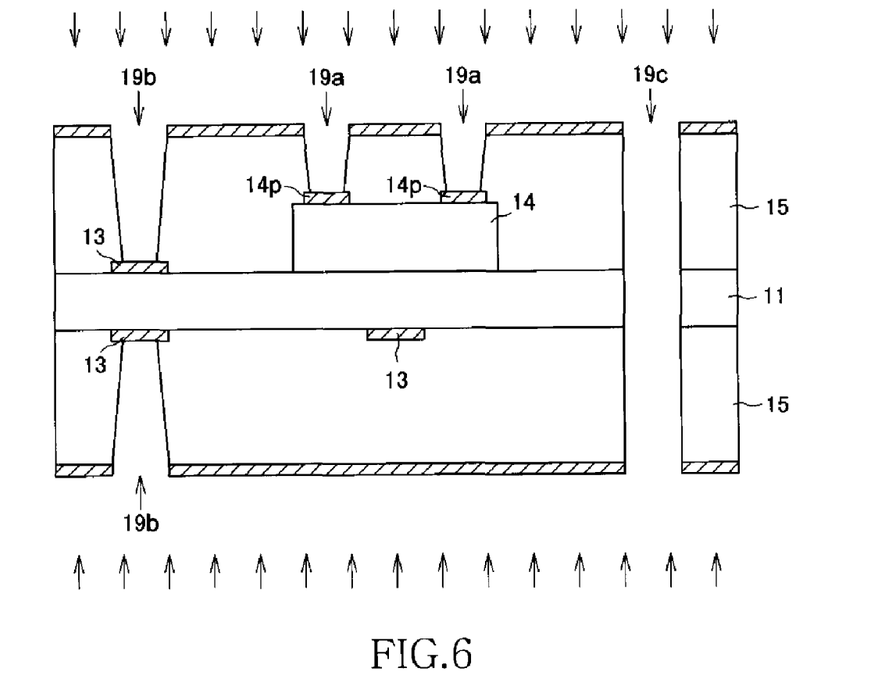
FIG. 6 is a schematic cross sectional view showing the process for manufacturing an IC-embedded substrate (Specifically a sand blasting treatment) according to the first embodiment of the present invention.

Next, via holes 19 are formed by a sand blasting treatment in which the copper foil 17 that has been subjected to a conformal process is used as a mask (FIG. 6). In the sand blasting treatment, the workpiece is ground by being blasted with non-metallic or metallic particles. Via holes of differing height can be formed by providing a conductive pattern (pad electrode or land) 13 in advance directly below the aperture patterns 18a to 18c. Specifically, the pad electrode 14p functions as a stopper when a via hole 19a is formed, and the semiconductor IC chip 14 is therefore not damaged. The inner-layer conductor pattern (land) 13 functions as a stopper when a via hole 19b is formed, and the via hole is therefore formed no deeper than the conductor pattern. In other words, the via holes 19a, 19b are blind holes, and the respective conductive layers form the bottoms of the via holes. On the other hand, there is no conductive layer that acts as a stopper located directly below the aperture pattern 18c, and a via hole 19c is therefore formed as a through-hole.

Thus, the via hole 19a is formed in a location in which the aperture pattern 18a is formed; the via hole 19b is formed in a location in which the aperture pattern 18b is formed; and the via hole 19c is formed in a location in which the aperture pattern 18c is formed. Specifically, the other via hole formed at the same time as the via hole 19a that is directly above the pad electrode 14p of the semiconductor IC chip 14 may be the via hole 19b that passes through only the build-up layer, or the via hole 19c that vertically passes completely through the multilayer substrate.

Figure 7:
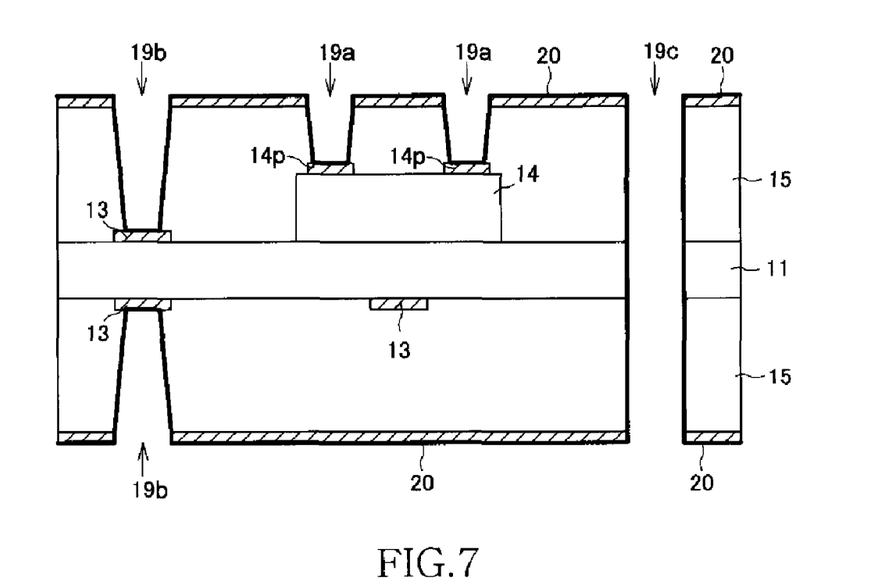
FIG. 7 is a schematic cross sectional view showing the process for manufacturing an IC-embedded substrate (Specifically forming an conductive underlayer 20) according to the first embodiment of the present invention.

Next, an conductive underlayer 20 is formed on substantially the entire exposed surface, which includes the inner wall surfaces of the via holes 19a to 19c (FIG. 7). The conductive underlayer 20 is preferably formed by electroless plating, but may also be formed by, e.g., sputtering or vapor deposition. The conductive underlayer 20 acts as a substrate for the electroplating subsequently performed. The underlayer can therefore be made extremely thin, with the thickness appropriately selected within a range of several tens of nanometers to several micrometers.

Figure 8:
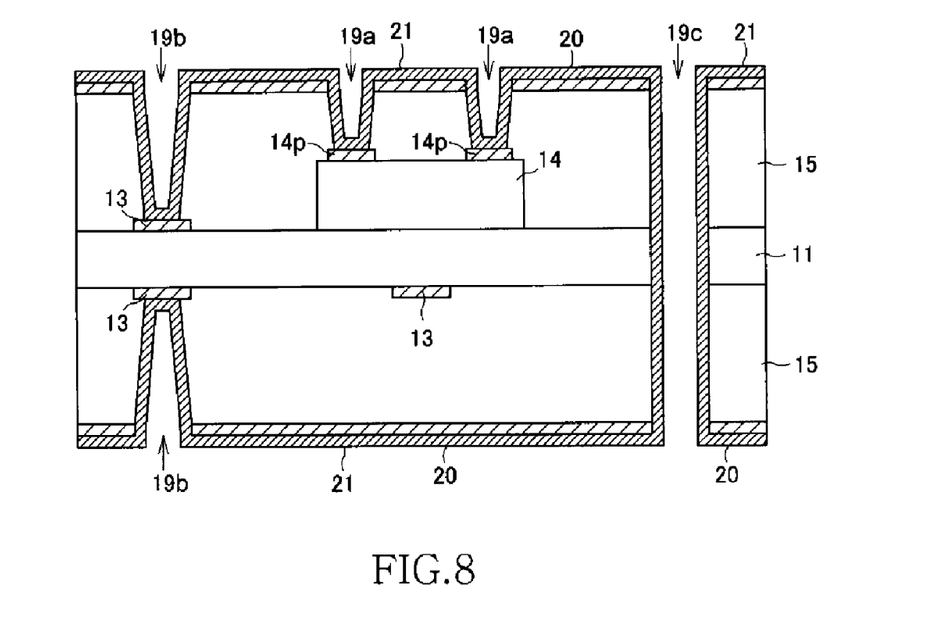
FIG. 8 is a schematic cross sectional view showing the process for manufacturing an IC-embedded substrate (Specifically electrolytic plating) according to the first embodiment of the present invention.

Next, the base conductive layer 20 is grown by electrolytic plating (FIG. 8). Thus, a conductive layer 21 (including the conductive underlayer 20) is formed on the inner wall surfaces of the via holes 19a to 19c. In the present embodiment, the interiors of the via holes 19a to 19c are not completely covered by the conductive layer 21, but the interiors of the via holes 19a to 19c can be completely covered by the conductive layer 21 if an appropriate plating solution is selected.

Figure 9:
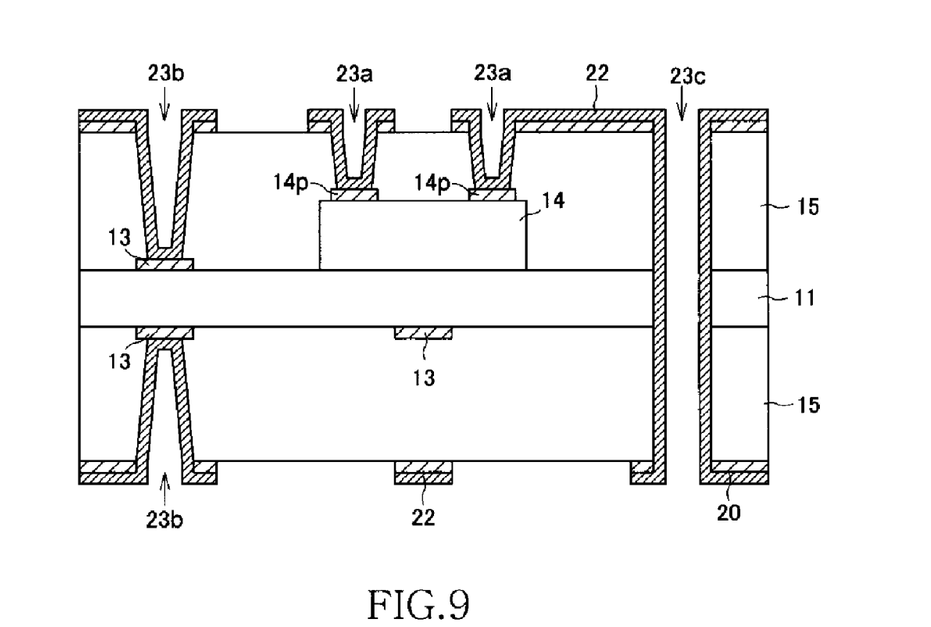
FIG. 9 is a schematic cross sectional view showing the process for manufacturing an IC-embedded substrate (Specifically forming a conductor pattern 22) according to the first embodiment of the present invention.

Next, the conductive layer 21 is selectively removed by photolithography and etching, whereby a conductor pattern 22 comprising wiring and lands is formed on the surface layer (outer layer) (FIG. 9). A single cycle of the process is thereby completed on a core substrate 10 to yield a completed IC-embedded substrate provided with a first via hole electrode 23a connected to the pad electrode 14p of the semiconductor IC chip 14, a second via hole electrode 23b connected to the wiring pattern (land) of the inner layer, and a third via hole electrode 23c that passes through the entire substrate.

As described above, according to the present embodiment, a semiconductor IC chip is encapsulated, conformal processing is then performed, and a via hole that is connected to a pad electrode of the semiconductor IC chip, and a normal via hole for connecting conductor patterns of individual layers are then simultaneously formed. The semiconductor IC chip is therefore not damaged by heat during laser processing or loading during polishing, the number of processing holes can be increased, and fine-pitch pad electrode applications can be addressed. Since the conductor pattern functions as a stopper, variations in the degree of polishing due to the differing heights of the via holes can be absorbed, and the range over which the degree of polishing is set can be expanded. Furthermore, the adhesive strength of the copper foil and the resin is increased; therefore, adequate wiring strength can be ensured.

A detailed description is provided of a second embodiment in which a semiconductor IC chip is mounted on a build-up layer, with reference being made to FIGS. 10 to 16. Constituent elements similar to those in the first embodiment have the same numerical symbols, and a description thereof is omitted.

Figure 10:
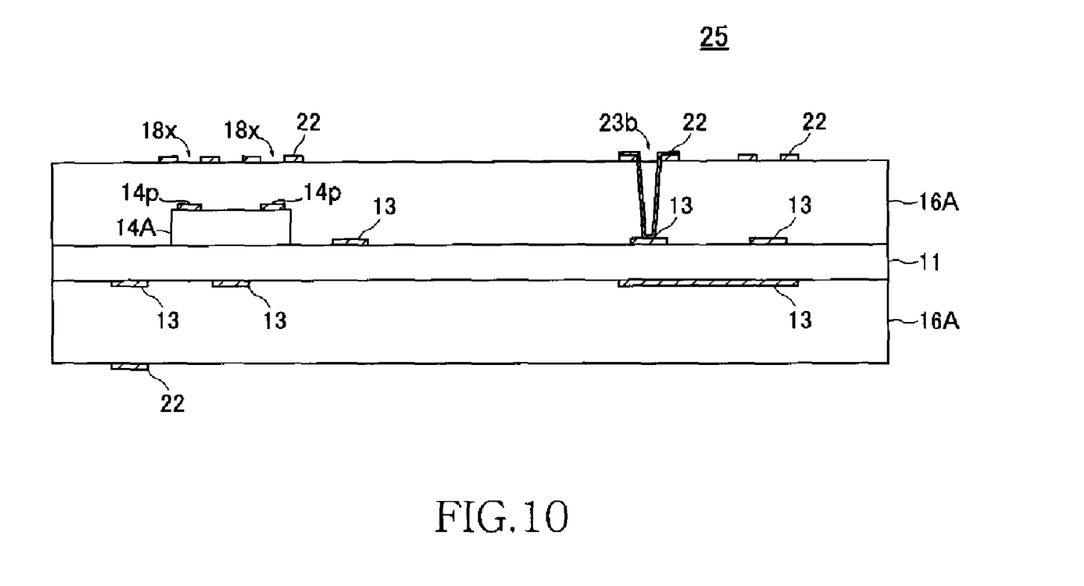
FIG. 10 is a schematic cross sectional view showing the process for manufacturing an IC-embedded substrate (Specifically preparing a multilayer substrate 25) according to the second embodiment of the present invention.

According to the method for manufacturing an IC-embedded substrate of the present embodiment, first, a multilayer substrate 25 is prepared (FIG. 10). The multilayer substrate 25 is provided with a core substrate 11; insulating layers (build-up layers) 16A formed on either side of the core substrate 11; a semiconductor IC chip 14A mounted on the core substrate 11 and encapsulated in the insulating layers 16A; an inner-layer conductor pattern 13 formed on the surface of the core substrate 11; a surface layer conductor pattern 22 formed on the surface of the insulating layers 16A; and a via hole electrode 23b, which is interlayer connecting means for electrically connecting the surface layer conductor pattern and the inner-layer conductor pattern 13. The conductor pattern 22 positioned directly above a pad electrode 14p of the semiconductor IC chip 14A has an aperture 18x. The multilayer substrate 25 thus configured is preferably manufactured by the method described with reference to FIGS. 1 to 9, but may also be manufactured by another method.

Figure 11:
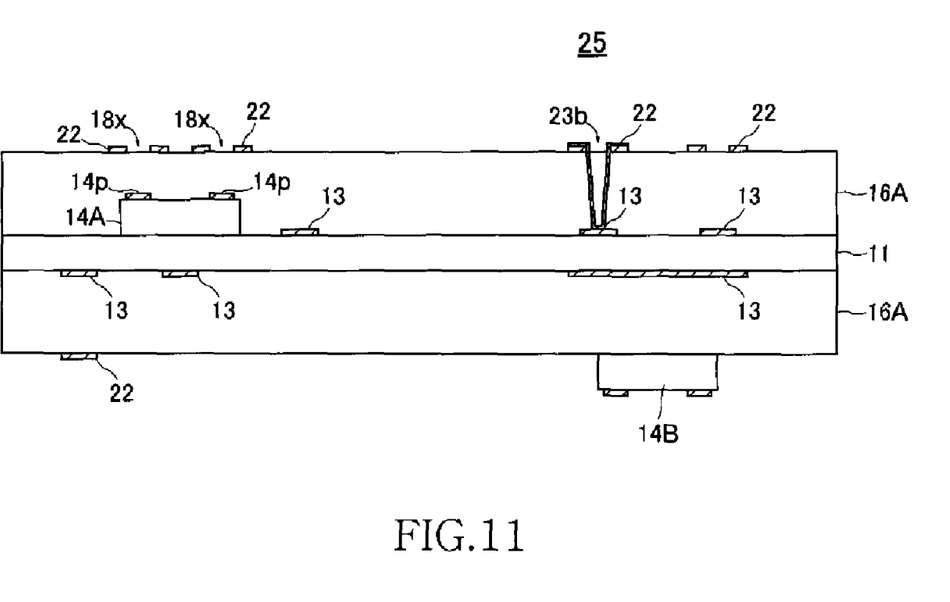
FIG. 11 is a schematic cross sectional view showing the process for manufacturing an IC-embedded substrate (Specifically mounting a semiconductor IC chip 14B) according to the second embodiment of the present invention.

Next, a semiconductor IC chip 14B is mounted face up in a prescribed region on the multilayer substrate 25 (FIG. 11). In practice, an operation is carried out to orient the processing surface of the multilayer substrate 25 face up, even when the semiconductor IC chip 14B is mounted. At this point, the semiconductor IC chip 14B is preferably temporarily secured to the core substrate 11 using an adhesive or the like.

Figure 12:
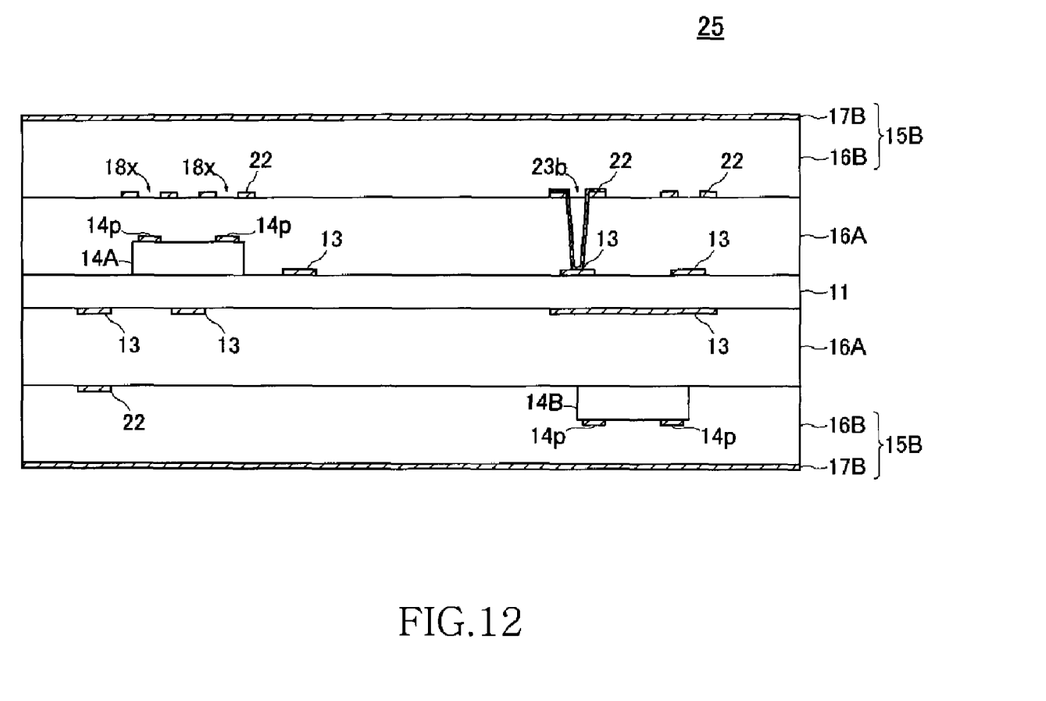
FIG. 12 is a schematic cross sectional view showing the process for manufacturing an IC-embedded substrate (Specifically affixing resin sheets 15B having a copper foil on one side) according to the second embodiment of the present invention.

Next, resin sheets 15B having a copper foil on one side are affixed to either side of the multilayer substrate 25 (FIG. 12). The resin sheets 15B having a copper foil on one side in the present embodiment also have a copper foil 17B affixed to one side of a thermosetting resin sheet 16B composed of a B-stage epoxy. Two such thermosetting resin sheets 15B having a copper foil on one side are prepared, and the resin sides thereof are affixed to either side of the multilayer substrate 25. The resin sheets 15B having a copper foil on one side are then integrated with the multilayer substrate 25 using a hot press. The semiconductor IC chip 14B is thereby encapsulated in the substrate, and the thermosetting resin sheet 16B and the copper foil 17B serve, respectively, as an insulating layer and a conductive layer of a build-up layer.

Figure 13:
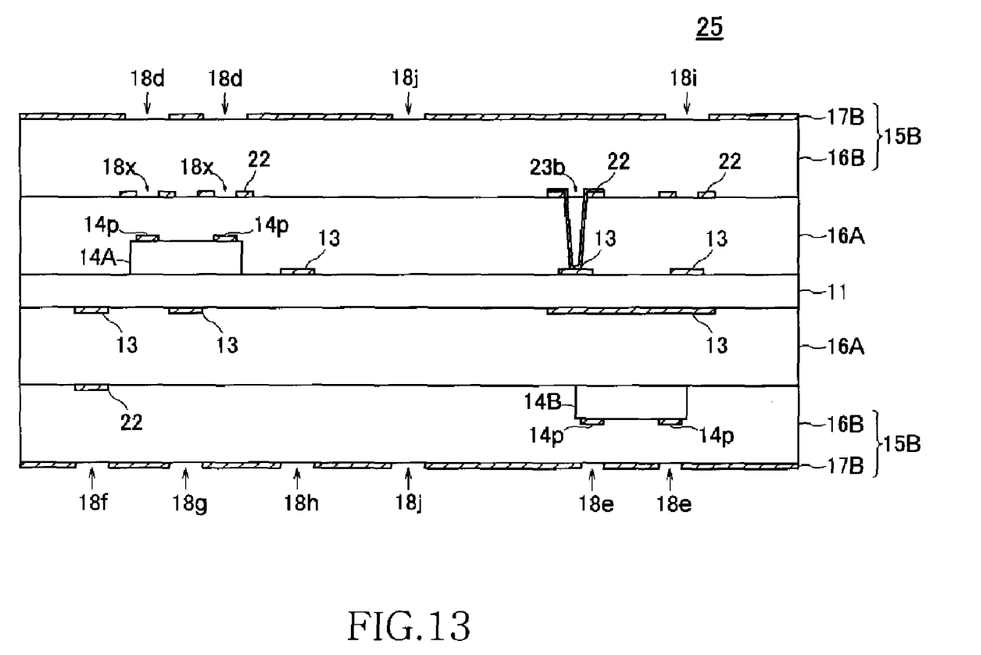
FIG. 13 is a schematic cross sectional view showing the process for manufacturing an IC-embedded substrate (Specifically a conformal process) according to the second embodiment of the present invention.

Next, the copper foil 17B formed on the surface of the build-up layer is selectively removed by a conformal process, whereby a mask pattern for forming via holes is formed (FIG. 13). The conformal process is basted on photolithography and etching, and fine precision can be performed with enhanced precision by etching a pattern in the copper foil 17B affixed in advance to the thermosetting resin sheet 16B to be processed. The diameter of the aperture pattern is not particularly limited, but is preferably about 30 to 200 µm, and is preferably increased depending on the depth of the via holes.

Thus, an aperture pattern 18d is formed directly above a pad electrode 14p of the semiconductor TC chip 14A; an aperture pattern 18e is formed directly above the pad electrode 14p of the semiconductor IC chip 14B; aperture patterns 18f, 18g, 18h, and 18i are formed directly above the conductor pattern 13 formed on the surface of the core substrate; and an aperture pattern 18j is formed in a prescribed region where the conductor pattern 13 has not been formed. Therefore, the aperture pattern 18x that is directly above the aperture pattern 18d has a smaller diameter than the aperture pattern 18d. Accordingly, via holes can be formed with a higher processing precision, and IC chip applications involving an even finer pitch can be addressed.

Figure 14:
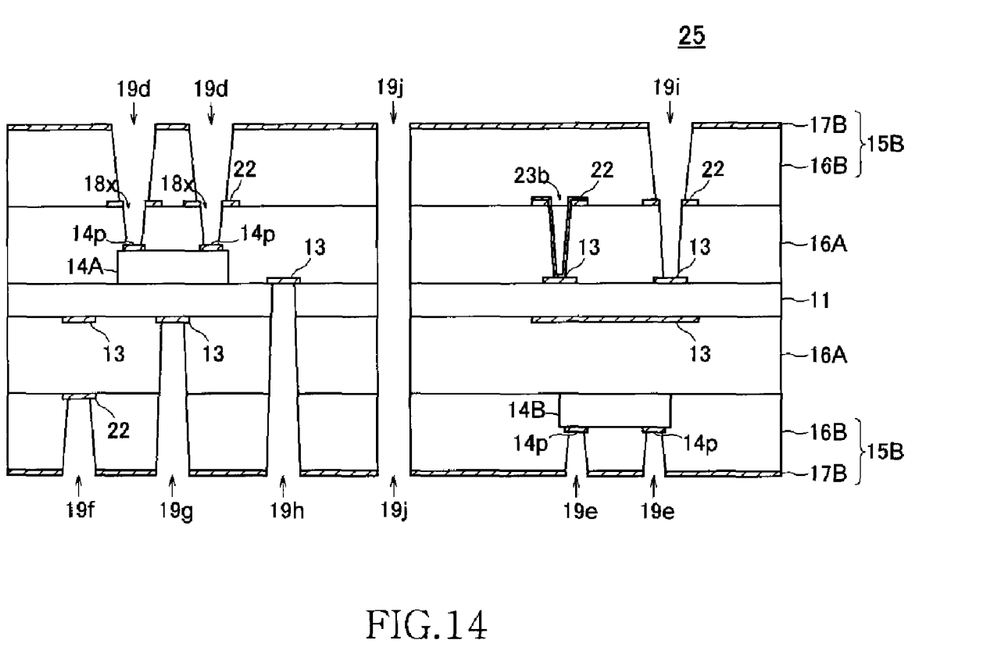
FIG. 14 is a schematic cross sectional view showing the process for manufacturing an IC-embedded substrate (Specifically a sand blasting treatment) according to the second embodiment of the present invention.

Next, via holes 19d to 19j are formed by a sand blasting treatment in which the copper foil 17B that has been subjected to a conformal process is used as a mask (FIG. 14). In the sand blasting treatment, the workpiece is ground by being blasted with non-metallic or metallic particles. Via holes of differing height can be formed by providing a conductive pattern (pad electrode or land) 13 in advance directly below the aperture patterns 18d to 18j. Specifically, the pad electrode 14p functions as a stopper when via holes 19d, 19e are formed, and the semiconductor IC chips 14A, 14B are therefore not damaged. The inner-layer conductor pattern (land) 13 functions as a stopper when via holes 19f, 19g, 19h, and 19i are formed, and the via holes are therefore formed no deeper than the conductor pattern. In other words, the via holes 19a to 19i are blind holes, and the respective conductive layers form the bottoms of the via holes. On the other hand, there is no conductive layer that acts as a stopper located directly below the aperture pattern 18j, and the via hole 19j is therefore formed as a through-hole. Furthermore, since the conductor pattern 22 that has an aperture pattern 18x acts as a mask for the via hole 19d, via holes can be formed with a higher processing precision, and applications for pad electrodes on semiconductor IC chips involving even finer pitches can be addressed.

Thus, the via holes 19d, 19e are formed in locations in which the aperture patterns 18d, 18e are formed; the non-penetrating via holes 19f, 19g, 19h and 19i are formed in locations where the aperture patterns 18f, 18g, 18h, and 18i are formed; and the through-hole type via hole 19j is formed in a location where the aperture 18j is formed. Specifically, the other via holes that may be formed at the same time as the via holes 19d, 19e directly above the pad electrode 14p of the semiconductor IC chips 14A, 14B include the via hole 19f that only passes through the surface layer build-up layer; the via holes 19g, 19i that pass not only through the surface layer, but also through the inner layer build-up layer; the via hole 19h that passes not only through the build-up layers, but also through the core substrate; and the via hole 19j that passes completely from top to bottom through the multilayer substrate.

Figure 15:
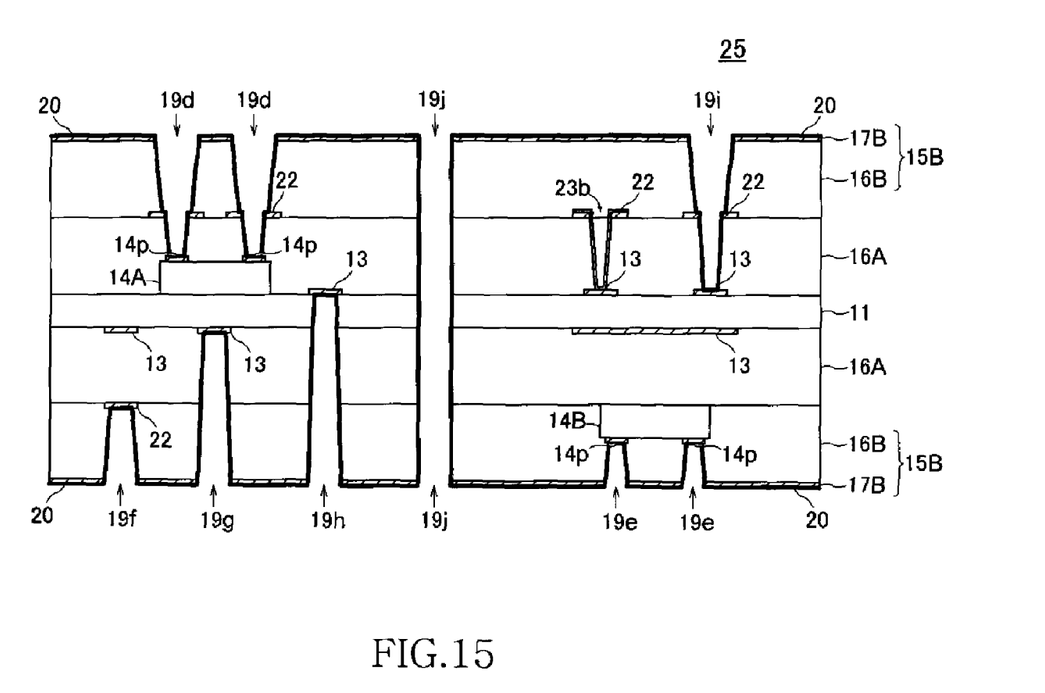
FIG. 15 is a schematic cross sectional view showing the process for manufacturing an IC-embedded substrate (Specifically forming an conductive underlayer 20) according to the second embodiment of the present invention.

Next, an conductive underlayer 20 is formed on substantially the entire exposed surface, including the inner wall surfaces of the via holes 19d to 19j (FIG. 15). The conductive underlayer 20 is preferably formed using electroless plating, but sputtering or vapor deposition may also be used. Since the conductive underlayer 20 acts as a substrate for the electroplating performed thereafter, the thickness thereof may be made extremely thin, and may be appropriately selected within a range of several hundred angstrom to 3.0 µm, for example.

Figure 16:
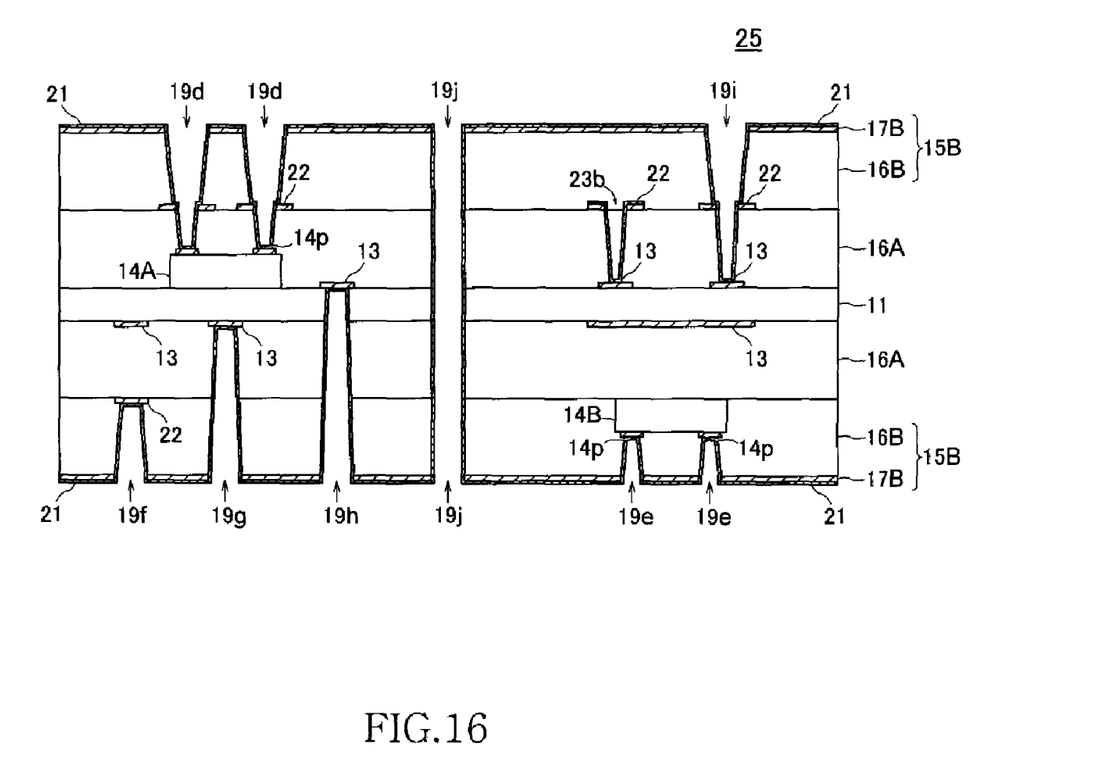
FIG. 16 is a schematic cross sectional view showing the process for manufacturing an IC-embedded substrate (Specifically electrolytic plating) according to the second embodiment of the present invention.

Next, the conductive underlayer 20 is grown by electrolytic plating (FIG. 16). A conductive layer 21 (including the conductive underlayer 20) is thereby formed in the inner wall surfaces of the via holes 19d to 19j. In the present embodiment, the inner portions of the via holes are not completely covered by the conductive layer 21, but the inner portions of the via holes 19d to 19j can be completely covered by the conductive layer 21.

Figure 17:
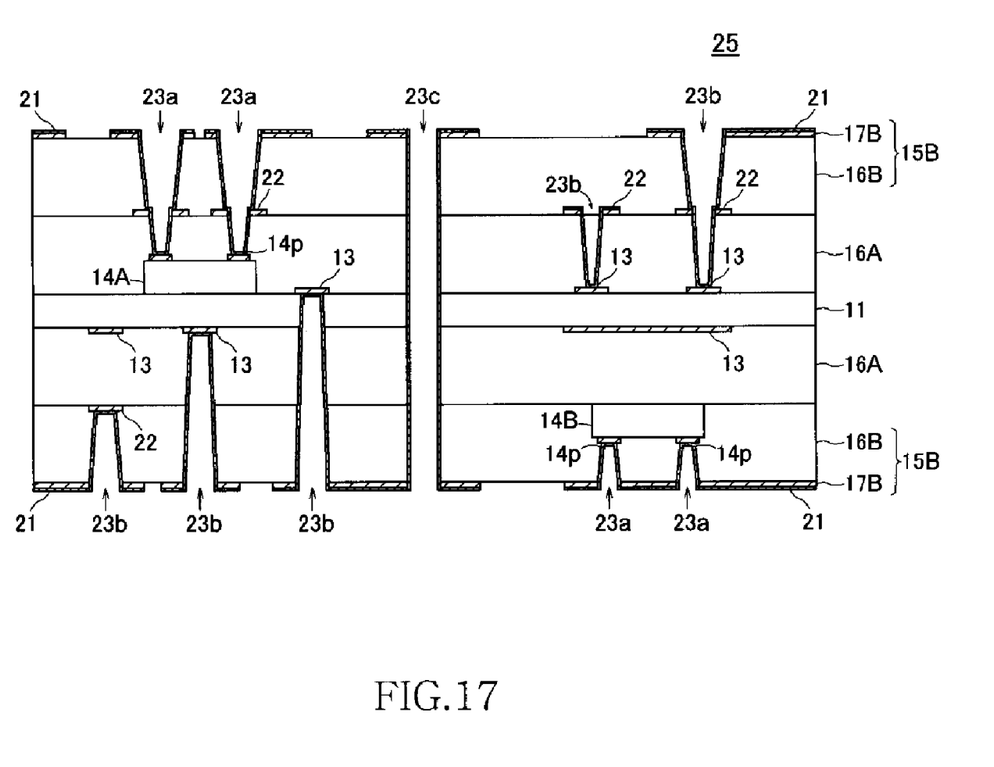
FIG. 17 is a schematic cross sectional view showing the process for manufacturing an IC-embedded substrate (Specifically forming a conductor pattern 22) according to the second embodiment of the present invention.

Next, the conductive layer 21 is selectively removed by photolithography and etching, whereby a conductor pattern 22 comprising wiring and lands is formed on the surface layer (outer layer) (FIG. 17). A single cycle of the process is thereby completed on a core substrate 10 to yield a completed IC-embedded substrate provided with a first via hole electrode 23a connected to the pad electrodes 14p of the semiconductor IC chip 14A and 14B, a second via hole electrode 23b connected to the wiring pattern (land) of the inner layer, and a third via hole electrode 23c that passes through the entire substrate.

As described above, according to the present embodiment, a semiconductor IC chip is encapsulated, conformal processing is then performed, and blasting is carried out to simultaneously form a via hole that is connected to a pad electrode of the semiconductor IC chip, and a normal via hole for connecting conductor patterns of individual layers. The semiconductor IC chip is therefore not damaged by heat during laser processing or loading during polishing, the number of processing holes can be increased, and fine-pitch pad electrode applications can be addressed. Since the conductor pattern acts as a stopper, variations in the degree of polishing due to the differing heights of the via holes can be absorbed, and the range over which the degree of polishing is set can be expanded. Furthermore, the adhesive strength between the copper foil and the resin is increased, and adequate wiring strength can therefore be ensured.

Next, a third embodiment of the present invention will be described in detail.

In the method for manufacturing an IC-embedded substrate according to the present embodiment, first, a core substrate 11 is prepared in the same manner as in the first embodiment described above (FIG. 11), and a copper foil 12 disposed on either side of the core substrate 11 is selectively removed by photolithography and etching, whereby a conductor pattern 13 comprising wiring and lands is formed on the core substrate 11 (FIG. 2). Next, a semiconductor IC chip 14 is mounted face up in a prescribed region on the core substrate 11 (FIG. 3), and resin sheets 15 having a copper foil on one side thereof are affixed to either side of the core substrate 11 on which the semiconductor IC chip 14 has been mounted (FIG. 4). Thus, the copper foil 17 formed on the surface of the build-up layer is selectively removed by conformal processing, whereby a mask pattern for forming the via holes is formed (FIG. 5). An aperture pattern 18a is thereby formed directly above the pad electrode 14p of the semiconductor IC chip 14; an aperture pattern 18b is formed directly above a conductor pattern 13 formed on the surface of the core substrate; and an aperture pattern 18c is formed in a prescribed area in which the conductor pattern 13 has not been formed.

Figure 18:
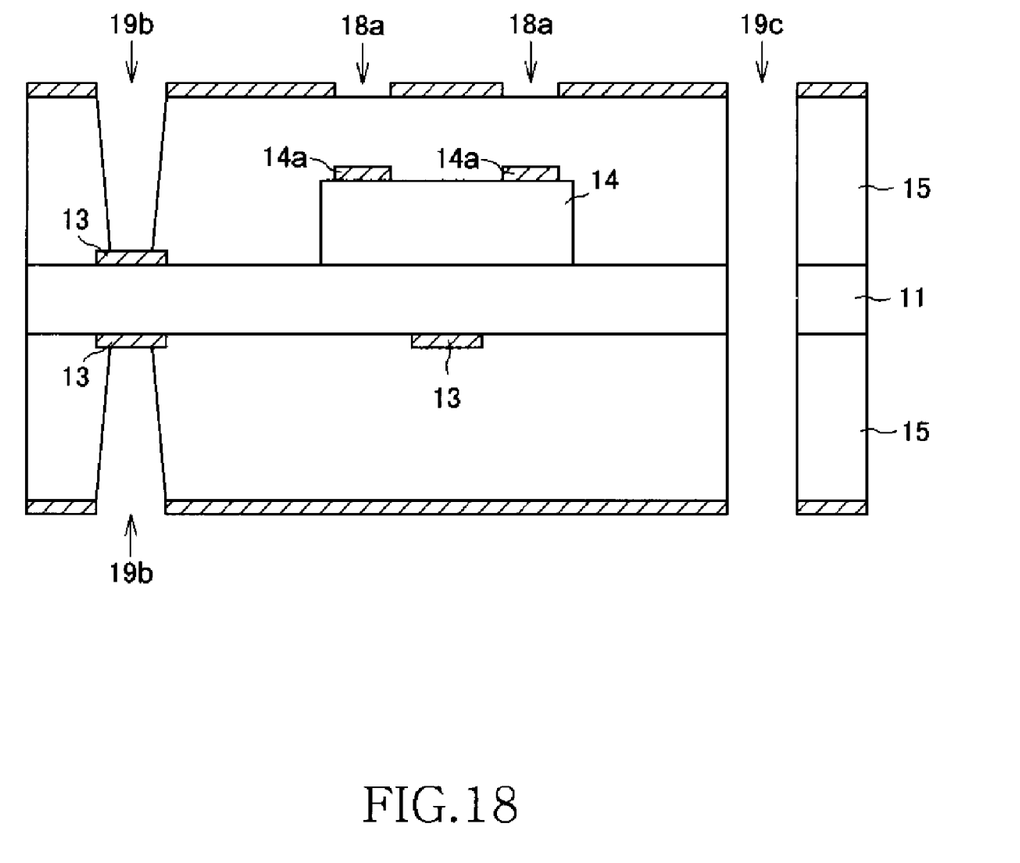
FIG. 18 is a schematic cross sectional view showing the process for manufacturing an IC-embedded substrate (Specifically laser processing) according to the third embodiment of the present invention.

Next, via holes 19b and 19c are formed by laser processing in a position in which the aperture patterns 18b and 18c are formed (FIG. 18). At this point, a conductive pattern (pad electrodes and lands) 13 is provided directly below the aperture patterns 18a to 18c, whereby via holes having differing depths can be formed. Specifically, the inner-layer conductor pattern (lands) 13 functions as a stopper when the via hole 19b is formed; therefore, the laser beam does not pass through the core substrate 11, and the conductor pattern 13 forms the bottom of the via hole. Since no conductive layer acting as a stopper is present directly below the aperture pattern 18c, the laser beam passes through the core substrate 11, and a via hole 19c is formed as a through-hole.

Next, a via hole 19a is formed by a sand blasting treatment in which the copper foil 17 that has been subjected to conformal processing is used as a mask. In the sand blasting treatment, the workpiece is ground by being blasted with a polishing medium comprising non-metallic or metallic particles. However, the pad electrode 14p functions as a stopper when the via hole 19a is formed; therefore, the via hole is not formed any deeper than the pad electrode, and the semiconductor IC chip does not get damaged. Since the smear of the via holes 19b and 19c formed by laser processing is simultaneously removed (desmeared), the sand-blasting treatment allows foreign matter in very small via holes to be definitively removed, and a high quality conductive layer (via hole electrode) can be formed without the separation of metal plating in the inner wall surfaces of the via holes during a subsequent plating process.

The subsequent steps are similar to those of the first embodiment (FIGS. 7 to 9), and a detailed description is therefore omitted. A processing cycle is completed on the core substrate by performing the above, yielding a completed IC-embedded substrate provided with a first via hole electrode 23a, which is connected to the pad electrode 14p on the semiconductor IC chip 14; a second via hole electrode 23b, which is connected to an inner layer wiring pattern (lands); and a third via hole electrode, which passes completely through the entire substrate.

As described above, according to the present embodiment, a semiconductor IC chip is encapsulated, conformal processing is then performed, a normal via hole connected between the conductor patterns of individual layers is formed by laser processing, and a via hole that is connected to the pad electrode of the semiconductor IC chip is formed by blasting. Therefore, the inner portion of the normal via holes connected between the conductor patterns of individual layers can be desmeared at the same time as the forming of a via hole connected to the pad electrode of the semiconductor chip. Since the via hole that is connected to the pad electrode of the semiconductor IC chip is formed by blasting, the semiconductor IC chip is not damaged by heat during laser processing or loading during polishing, the number of processing holes can be increased, and fine-pitch pad electrode applications can be addressed. Since the conductor pattern functions as a stopper, variations in the degree of polishing due to the differing heights of the via holes can be absorbed, and the range over which the degree of polishing is set can be expanded. Furthermore, the adhesive strength of the copper foil and the resin is increased; therefore; adequate wiring strength can be ensured.

The present invention has thus been shown and described with reference to specific embodiments. However, it should be noted that the present invention is in no way limited to the details of the described arrangements but changes and modifications may be made without departing from the scope of the appended claims.

For example, a resin substrate having a copper foil affixed to either side is used as a core substrate in the embodiments, and resin sheets having a copper foil affixed to one side are used as the build-up layer. However, the use of copper foil in the present invention is not limiting, and another type of metal layer may be used.

A case was described in the embodiments in which a semiconductor IC chip is embedded in a multilayer substrate. However, the embedded element in the present invention is not limited solely to semiconductor IC chips, and any of a variety of electronic components may be embedded therein (e.g., L, C, or R individual chip sets; LCR composite chip sets using L, C, and R arrays and ceramic multilayer substrates; and the like). In this case, the number of pad electrodes increases with the number of mounted elements, and the pad electrodes have various heights. However, according the present invention, an increase in processing holes is not accompanied by a decrease in productivity, the elements are not damaged by stresses during polishing, and variations in the degree of polishing due to the differing heights of the via holes can be absorbed. Specifically, the present invention enables a variety of traditionally complex problems that accompany an increase in the number of embedded elements to be resolved.

What is claimed is:

1. A method for manufacturing an IC-embedded substrate, comprising:

a first step for encapsulating at least an IC chip having a pad electrode in an insulating layer;

a second step for forming a metal layer having at least a first aperture in a location directly above the pad electrode of the IC chip, and a second aperture in a location above an area other than the area in which the IC chip is mounted; and a third step for selectively removing the insulating layer by a blasting treatment in which the metal layer is used as a mask, thereby forming a first via hole that corresponds to the first aperture and a second via hole that corresponds to the second aperture, wherein the blasting treatment is effective to form the first via hole by removing the insulating layer from a lower end of the first aperture to an upper end of the pad electrode.

2. The method for manufacturing an IC-embedded substrate as claimed in claim 1, wherein the third step includes a step for forming the second via hole in a position that exposes a conductor pattern formed in an area other than the area in which the IC chip is mounted.

3. The method for manufacturing an IC-embedded substrate as claimed in claim 1, wherein the second via hole contains a penetrating via hole that completely penetrates the entire multilayer substrate.

4. The method for manufacturing an IC-embedded substrate as claimed in claim 1, wherein the diameter of the second aperture is larger than the diameter of the first aperture.

5. The method for manufacturing an IC-embedded substrate as claimed in claim 1, wherein another metal layer having a third aperture in a position directly above the pad electrode of the IC chip is preferably disposed between the IC chip and the metal layer, and the third step comprises a step for forming the first via hole by a blasting treatment in which the metal layer and the other metal layer are used as a mask.

6. The method for manufacturing an IC-embedded substrate as claimed in claim 5, wherein the diameter of the third aperture is smaller than the diameter of the first aperture.

7. The method for manufacturing an IC-embedded substrate as claimed in claim 1, wherein the third step includes a step for forming a second via hole by laser-processing the location where the second aperture is formed and then performing a blasting treatment in which the metal layer is used as a mask.

8. The method for manufacturing an IC-embedded substrate as claimed in claim 1, wherein the first step includes a step for encapsulating not only the IC chip but other electronic components in the insulating layer.

9. The method for manufacturing an IC-embedded substrate as claimed in claim 8, wherein the electric components are chip components of a passive element.

* * * * *